US008736268B2

(12) United States Patent
Schaefer (10) Patent No.: US 8,736,268 B2
(45) Date of Patent: May 27, 2014

(54) DEVICE FOR CORRECTING SET-POINT SIGNALS AND SYSTEM FOR THE GENERATION OF GRADIENTS COMPRISING SUCH A DEVICE

(75) Inventor: Ernest Schaefer, Rott (FR)

(73) Assignee: Bruker BioSpin S.A.S., Wissembourg (FR)

( * ) Notice: Subject to any disclaimer, the term of this patent is extended or adjusted under 35 U.S.C. 154(b) by 579 days.

(21) Appl. No.: 12/912,093

(22) Filed: Oct. 26, 2010

(65) Prior Publication Data

US 2011/0099356 A1  Apr. 28, 2011

(30) Foreign Application Priority Data

Oct. 26, 2009 (FR) .................................. 09 57487

(51) Int. Cl.
*G01R 33/385* (2006.01)
*G06F 9/22* (2006.01)
*G06F 9/30* (2006.01)

(52) U.S. Cl.
CPC .......... *G01R 33/3852* (2013.01); *G01R 33/385* (2013.01); *G06F 9/22* (2013.01); *G06F 9/3001* (2013.01)
USPC ............................ 324/322; 324/318; 324/307

(58) Field of Classification Search
USPC .......................... 324/300–322; 600/407–435; 382/128–131; 712/221–227
See application file for complete search history.

(56) References Cited

U.S. PATENT DOCUMENTS

| 4,743,851 | A | | 5/1988 | Lim et al. | |
|---|---|---|---|---|---|
| 5,126,672 | A | | 6/1992 | Le Roux | |
| 5,262,725 | A | * | 11/1993 | Cuppen et al. | 324/312 |
| 5,291,610 | A | * | 3/1994 | Hoenninger, III | 712/226 |
| 5,349,296 | A | | 9/1994 | Cikotte et al. | |
| 5,481,744 | A | * | 1/1996 | Hoenninger, III | 712/227 |
| 5,910,728 | A | * | 6/1999 | Sodickson | 324/309 |
| 7,123,009 | B1 | * | 10/2006 | Scott | 324/311 |
| 7,683,614 | B2 | * | 3/2010 | Posse | 324/307 |
| 7,944,206 | B2 | * | 5/2011 | Frydman et al. | 324/309 |
| 2007/0252597 | A1 | * | 11/2007 | Posse | 324/307 |
| 2010/0001727 | A1 | * | 1/2010 | Frydman et al. | 324/310 |
| 2010/0117649 | A1 | * | 5/2010 | Nakanishi et al. | 324/318 |
| 2011/0099356 | A1 | * | 4/2011 | Schaefer | 712/221 |

FOREIGN PATENT DOCUMENTS

| EP | 1176718 A2 | 1/2002 |
|---|---|---|
| GB | 2149509 A | 6/1985 |
| WO | 8908852 A1 | 9/1989 |

OTHER PUBLICATIONS

French Search Report, dated May 6, 2010, from corresponding French application.

* cited by examiner

*Primary Examiner* — Melissa Koval
*Assistant Examiner* — Tiffany Fetzner
(74) *Attorney, Agent, or Firm* — Young & Thompson (57) ABSTRACT

A device for real-time correction of set-point signals intended to receive at the input set-point signals and to deliver at its output set-point signals that are modified to compensate for defects, negative effects or the like subsequently encountered during the processing and/or the application of the set-point signals. This device (1) includes at least one circuit (1') that is based on a microprogrammed structure and composed of several subassemblies (3, 4, 5, 6, 6') that work with digital components essentially including a micro-sequencer (3) forming a counter, a memory (4) for storing micro-instructions, and a processing unit (5) combined with at least one working memory (6, 6') and integrating arithmetic calculation modules (7,7'), whereby the processing unit (5) modifies the data of set-point signals in accordance with the micro-instructions that are addressed by the micro-sequencer (3) and by taking into account the correction coefficients that are provided.

14 Claims, 6 Drawing Sheets

| | |
|---|---|
| 0 | x(n) |
| 1 | -x(n-1); -x(n) |
| 2 | y1(n-1); y1(n) |
| 3 | y2(n-1); y2(n) |
| 4 | y3(n-1); y3(n) |
| 5 | x(n)-x(n-1) |
| 6 | -B1y1(n-1); x(n)+y1(n) |
| 7 | -B2y2(n-1); y2(n)+y3(n) |
| 8 | -B3y3(n-1); y(n) |
| 9 | A1(x(n)-x(n-1)) |
| A | A2(x(n)-x(n-1)) |
| B | A3(x(n)-x(n-1)) |

Fig. 11

| | |
|---|---|
| 0 | A1 |
| 1 | B1 |
| 2 | A2 |
| 3 | B2 |
| 4 | A3 |
| 5 | B3 |

Fig. 12

DEVICE FOR CORRECTING SET-POINT SIGNALS AND SYSTEM FOR THE GENERATION OF GRADIENTS COMPRISING SUCH A DEVICE

FIELD OF THE INVENTION

This invention relates to the field of signal processing, more particularly the correction of signals.

BACKGROUND OF THE INVENTION

More specifically, the object of the invention is a digital device that makes it possible to calculate, in real time, a set-point signal that is corrected and intended in particular to be used in units for the generation of magnetic field gradients.

The latter are commonly employed in spectrometry by nuclear magnetic resonance (NMR) and magnetic resonance imaging (MRI) systems.

In a known manner, the gradients are produced by coils placed inside the magnet that generates the constant primary magnetic field. These coils are controlled by current amplifiers, where their set point usually is given in voltage and generally consists of a train of pulses.

This set point is generated by a digital device whose input is a sequence switch, constituting a programmable pulse generator, and the output is a digital-to-analog conversion stage that provides set-point voltage.

The pulse generator is programmed based on the type of analysis that is to be performed by the spectrometer or the imager.

Figure 1:
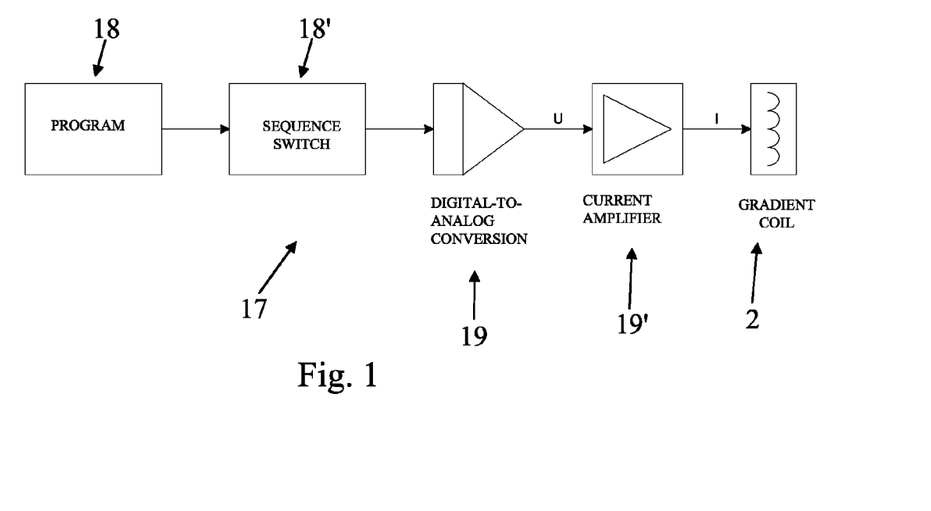
FIG. 1 is a schematic block diagram which shows the different essential constituent components of a system for the generation of gradients.

FIG. 1, attached, shows the different essential constituent components of a system for the generation of gradients.

Figure 2:
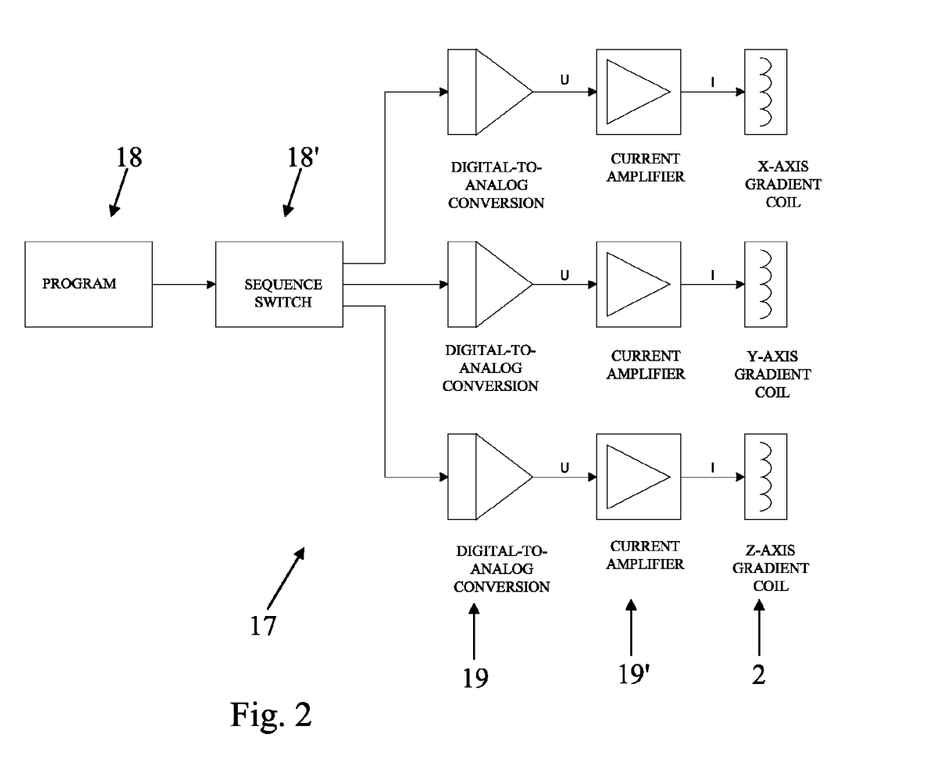
FIG. 2 diagrammatically illustrates a common configuration of such a system which makes it possible to generate field gradients along the three axes (X, Y and Z, the latter being collinear with the primary field)

A common configuration of such a system makes it possible to generate field gradients along the three axes (X, Y and Z, the latter being collinear with the primary field), as shown in FIG. 2, attached.

Other configurations of systems are also known and employed.

It is also known that, during the variation of the magnetic field in a gradient coil, Foucault currents appear on conductive elements that are outside of the coil and are subject to this field. These currents produce a magnetic field that opposes the field of the gradients.

Figure 3:
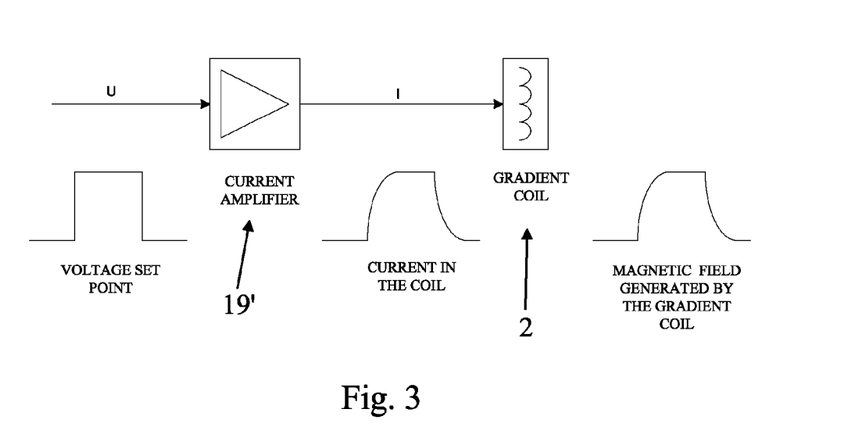
FIG. 3 diagrammatically illustrates the effect of Foucault currents on the magnetic field that is generated by a gradient coil.

By taking into consideration, for example, a gradient coil through which a current pulse passes, the build-up time of the magnetic field created by this coil will be influenced by the field that is produced by the Foucault currents. This phenomenon is illustrated in FIG. 3, attached (illustration of the effect of Foucault currents on the magnetic field that is generated by a gradient coil).

The degradation of the gradient field by the one produced by the Foucault currents has a detrimental influence on the performances of the spectrometer or the imager. It is consequently necessary to reduce to the maximum the effect of the Foucault currents on the gradient field.

Figure 4:
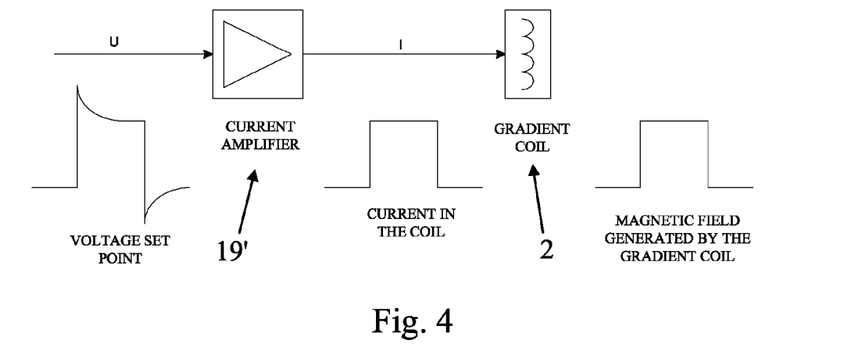
FIG. 4 diagrammatically illustrates a correction (of the pre-accentuation type, for example) which can be applied to the voltage set point so as to compensate the effects of the Foucault currents.

For this purpose, a correction (of the pre-accentuation type, for example) can be applied to the voltage set point so as to compensate for the effect of the opposite field (FIG. 4, attached, illustrates such a correction of the effects of the Foucault currents).

The digital solutions that are proposed as of this time for making such a correction are primarily of two types: namely the entirely hardware solutions (based on stateful machines, for example), and software solutions (employed on a DSP [digital signal processing] signal-processing microprocessor, for example).

The first type of solution results in a rigid and fixed implementation, and the second type of solution experiences limited performance.

The document U.S. Pat. No. 5,349,296 discloses an NMR imager that integrates in particular a system for supplying gradient coils, able to provide set-point signals specific to each channel and formed from series of codes describing the wave profiles to be applied.

According to this document, the supply system can also integrate, without their nature being specified in advance, means for pre-emphasis correction acting on the analog signals that are delivered to different channels and using predefined parameters.

Thus, these correction means do not act on digital data, and they do not make it possible to make a correction by recursive operation.

The result is a limited, totally fixed correction method whose performance cannot be easily estimated in advance and is in any case limited.

SUMMARY OF THE INVENTION

This invention has the object in particular of proposing an improved solution that makes it possible to overcome at least some, and preferably all, of the limitations of the solutions mentioned above.

In addition, the solution that is proposed by the invention should exhibit a flexibility of use on two levels: namely, on the one hand, for the same type of corrective processing to allow the use of parameters for easily modifiable correction, manually or automatically, and, on the other hand, the implementation of corrective processing of different natures, without requiring modification of the hardware structure of the device.

In addition, the solution that is proposed by the invention should also make possible, on the one hand, a good predictability of the performance, and, on the other hand, good management of the use of hardware resources that are implemented because of a simple structure and a simple composition.

For this purpose, the invention has as its object a device for real-time correction of variable set-point or control signals of gradient coils of a spectrometry or imagery device by nuclear magnetic resonance based on factors or coefficients for correction or compensation that are provided, whereby said device is designed to receive at the input original digital set-point signals and to deliver at its output set-point signals that have been modified to compensate for defects, limitations, disruptions, interference, negative effects or the like subsequently encountered during the processing, the transmission, the transformation and/or the application of said set-point signals, device characterized in that it consists of at least one circuit that is based on a microprogrammed structure and composed of several subassemblies that work with digital components essentially comprising a micro-sequencer forming a counter, a memory for storing micro-instructions, and a processing unit combined with at least one working memory and integrating arithmetic calculation modules, and in that said processing unit is capable of and designed to modify the data of original digital set-point signals by taking into account the factors or coefficients for correction or compensation that are provided and in accordance with the micro-instructions that are addressed by the micro-sequencer in the storage memory and that form a correction algorithm that controls the operation of different operational subassemblies that constitute the correction device and are programmed based on the correction to be implemented. Although numerous applications of this correction device can be envisioned, it is more particularly experienced at present in its implementation in the NMR/MRI context.

Thus, the invention also relates to a system for the generation of magnetic field gradients essentially comprising means for the generation of a digital set-point signal, for example in the form of a train of pulses, means for conversion and amplification of the set-point signal, if necessary, suitable for one method, and one or more coil(s) for the generation of gradients supplied by the amplified signal(s) provided by the combined conversion and amplification means, if necessary respectively corresponding, whereby said system also comprises a device for correction of the set-point signal before its analog conversion and its amplification, and if necessary, its demultiplication, a system that is characterized in that the correction device is a device as described above.

The correction process that results from the implementation of these different hardware and software arrangements consists in generating, within the context of the production of magnetic field gradients, a real-time correction by a digital device that is inserted between the pulse generator and the digital-to-analog conversion stage in a generation system of the above-mentioned type.

The correction device can, for example, but in a nonlimiting manner, implement a high-pass digital filter so as to apply a pre-accentuation or a pre-distorsion to the set-point signal (see FIG. 4, attached). The digital correction device according to the invention will also be called "corrector" below.

Since the correction that is provided advantageously can be parameterized (in connection with the characteristics of the gradient coil or the amplifier, for example), the calculations that are performed by the corrector take into consideration coefficients that come from an external device. These coefficients can be calculated based on parameters that are entered manually by the operator or by an automated device.

The above-mentioned parameters, whose use makes it possible to determine the correction coefficients implemented by the correction device, can, for example, be determined or result from measurements that are made in advance and that make it possible to deal with the effects of Foucault currents (see, for example, WO 89/08852).

Once set, these coefficients no longer vary as long as the components of the system do not change; their calculation therefore does not deal with the real-time aspect contrary to operations performed by the corrector.

However, their values can be easily modified either by the user (programming) or automatically, based on hardware and/or environmental modifications.

In addition, taking into account its embodiment (microprogrammed structure), the performance expressed in terms of rapidity of processing of the corrector depends essentially on the clock frequency that is applied, and processing cycles of several hundred nanoseconds can be easily achieved. In addition, the performance level of the corrector can be determined in advance.

BRIEF DESCRIPTION OF THE DRAWINGS

The invention will be better understood, owing to the description below, which relates to a preferred embodiment, provided by way of nonlimiting example and explained with reference to the accompanying schematic drawings, in which.

DETAILED DESCRIPTION OF THE INVENTION

Figure 6:
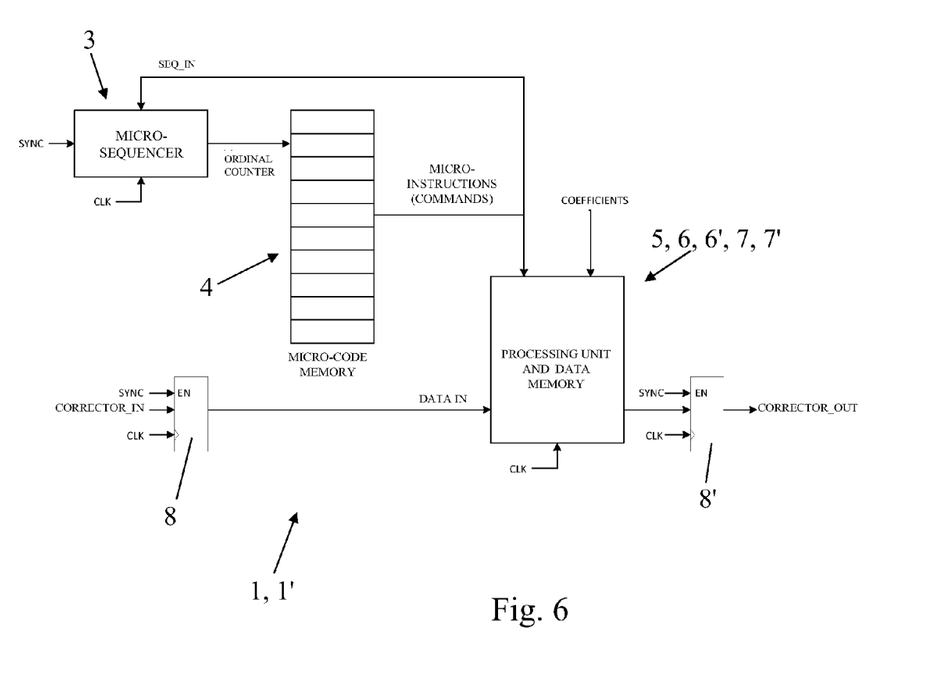
FIG. 6 is a schematic diagram that illustrates the composition of a correction device according to one embodiment of the invention.
Figure 7:
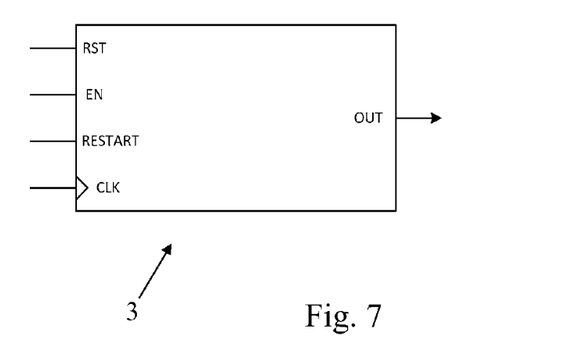
FIG. 7 diagrammatically illustrates the different input and output signals of a micro-sequencer that is part of the device of FIG. 6.
Figure 8:
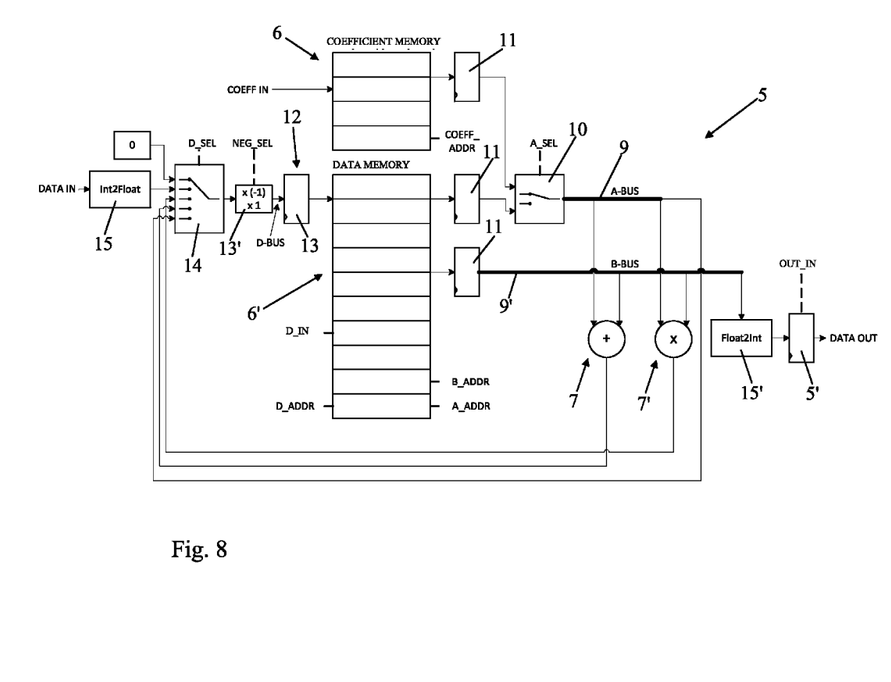
FIG. 8 is a schematic block diagram of an operating system [processing/working memory unit] that is part of the device of FIG. 6.
Figure 9:
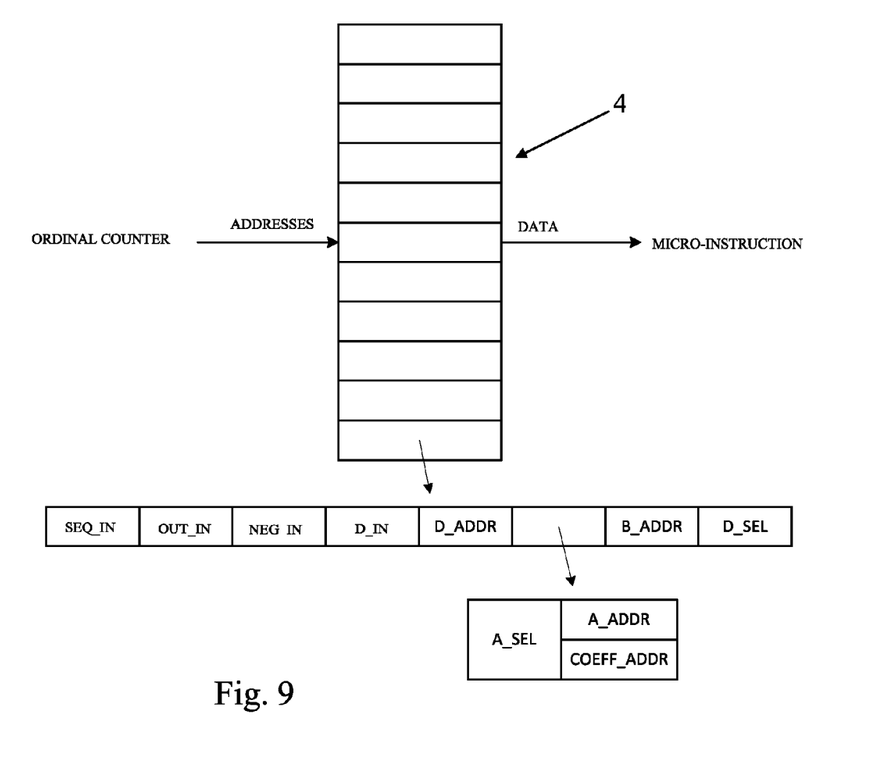
FIG. 9 diagrammatically illustrates the composition of the micro-instructions storage memory that is part of the device of FIG. 6, as well as the composition and arrangement of one line of micro-instructions.

FIG. 6 of the accompanying drawings shows, in relation to FIGS. 7 to 9, a device 1 for real-time correction of set-point or control signals based on factors or coefficients of correction or compensation that are provided, in particular, for the correction of the set-point signals that are intended for the control of gradient coils 2 of a spectrometry or imagery device by nuclear magnetic resonance.

Such a device 1 is intended to receive at the input original digital set-point signals and to deliver at its output set-point signals that have been modified or corrected to compensate for defects, limitations, disruptions, interference, negative effects or the like encountered subsequently during the processing, the transmission, the transformation and/or the application of said set-point signals.

According to the invention, said correction device 1 consists of at least one circuit 1' that is based on a micro-programmed structure and consists of several subassemblies 3, 4, 5, 6, 6' that work with digital components that comprise essentially one micro-sequencer 3 that forms a counter, a micro-instructions storage memory 4, and a processing unit 5 combined with at least one working memory (6, 6') and integrating arithmetic calculation modules 7, 7', and said processing unit 5 is capable of and intended to modify the data of the original digital set-point signals by taking into account the factors or coefficients for correction or compensation that are provided and in accordance with the micro-instructions that are addressed by the micro-sequencer 3 in the storage memory 4 and that form a correction algorithm that controls the operation of different operational subassemblies 3, 5, 6, 6' that constitute the correction device 1 and are programmed based on the correction to be implemented.

According to a first characteristic of the invention, the sequencing of the data at the input register 8 and the output register 8' of said device 1 as well as the resetting to zero of the micro-sequencer 3 are controlled by a synchronization signal SYNC whose period is a multiple of the clock signal CLK that concatenates the operation of the different constituent subassemblies.

In addition, the arithmetic calculation modules preferably consist of pipelines (transmission lines arranged in stages).

According to another characteristic of the invention, the working memory(ies) 6, 6' comprise(s) at least a first memory zone 6 that is intended to store the correction coefficients that are to be applied and at least a second memory zone 6' that is intended to store the input datum to be corrected, the intermediate result(s) of the arithmetic operations implemented by the arithmetic calculation modules, and the final result corresponding to the corrected output datum, as well as, if necessary, one or more preceding input datum/data.

There can be provided either a single working memory comprising at least two separate storage zones 6 and 6' or two separate working memories 6 and 6'.

According to an additional characteristic of the invention, said at least one second memory zone 6' is also capable of and intended to store the output datum/data of at least one corrected set-point signal that is produced during at least one prior correction cycle, for example the corrected set-point signal of the preceding cycle, and in that the current corrected set-point signal results from a convolution operation that is implemented by means of the calculation modules 7, 7'.

The arrangement and the interconnection of the different subassemblies, in particular memories 6, 6' and calculation modules 7, 7', thus allow a recursive operating mode of the device 1.

The prediction of storage memories 4 and working memories 6, 6' as explained above imparts great flexibility to the device 1. Actually, they make it possible to perform:

The updating of the correction coefficients or factors in real time (contents of the memory 6), The modification of the type of operations implemented by the corrector 1 by updating the micro-program (contents of the memory 4) without modification of the basic structure of the corrector 1 (arithmetic units, etc.).

Consistent with an advantageous practical implementation of the invention, and as FIG. 8 of the accompanying drawings illustrates it, the processing unit 5 also comprises, on the one hand, buses 9, 9' for transmission of operands, optionally combined with at least one multiplexer 10 that supplies the arithmetic calculation modules 7, 7', based on elementary control signals of the micro-instructions to be executed, with data and coefficients extracted from the working memory(ies) 6, 6' by means of read ports 11, and, on the other hand, at least one data supply bus 12 connected to a write port 13 of the second memory or memory zone 6' and optionally to one sign inversion module 13', and combined upstream with a multiplexer 14 that is connected to the outputs of the arithmetic calculation modules 7, 7', to the input register 8 of the datum to be corrected, if necessary to at least one of the buses 9, 9' for transmission of operands, and optionally to a zeroing register, the state of said multiplexer 14 also being determined by the elementary control signals of the micro-instructions to be executed.

When the format of the digital data manipulated by the processing unit 5 and stored in the working memories 6, 6' is different from that or those of the format(s) of digital data at the input (DATA-IN) or at the output (DATA-OUT), it can be provided that the device 1 also comprises mutually inverse conversion modules 15, 15', at the input and at the output, whereby input data and output data are, for example, coded integers in two's complement (FIG. 6).

Consistent with a very preferred embodiment of the invention, the two conversion modules 15 and 15' respectively consist of a module for conversion of integers into double-precision floating-comma 64-bit numbers, preferably according to the standard IEEE 754, and a similar inverse conversion module. The correction device or corrector 1 can consequently be easily inserted or fit into a gradient generation system, without modifying the nature of the delivered signals (the modified set-point signal as well as the original set-point signal remain in digital form) and without disrupting the flow of said signals (real-time correction, the correction system introducing a minimal delay that is compatible with the application), this while transposing the data from the digital set-point signals into a format that facilitates the precision of their corrective processing.

Although the invention is described and shown more particularly within the framework of a linear structure, one skilled in the art easily understands that in the case of multiple paths or large quantities of data to be processed, the correction device 1 can have a vectorial structure and can comprise several circuits 1' that are arranged in parallel, each circuit integrating a functional group [micro-sequencer 3/storage memory 4/processing unit 5, and working memory(ies) 6, 6'].

Figure 10:
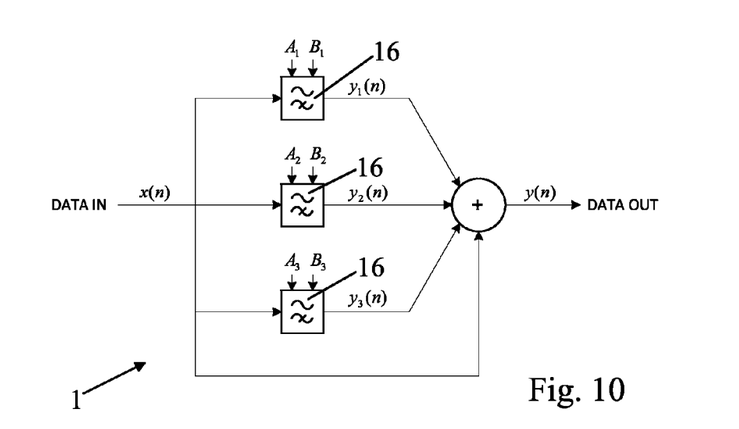
FIG. 10 is a schematic representation that illustrates an application of the device of FIG. 6 in the form of three filtering cells in parallel.

According to a possible application of the invention, brought out by FIG. 10, the device 1 can be programmed for implementing three filtering cells 16 that are arranged in parallel, each cell preferably corresponding to a high-pass digital filter of the first order.

The correction device 1 has a great flexibility of use and can be used to perform various types of operations on the signal that is to be corrected, for example an amplifier set-point signal. Consequently, it is possible, for example, also to be used to correct the linearity defects of the amplifier of gradients 19' in an application in connection with a system 17 for the generation of magnetic field gradients.

Figure 5:
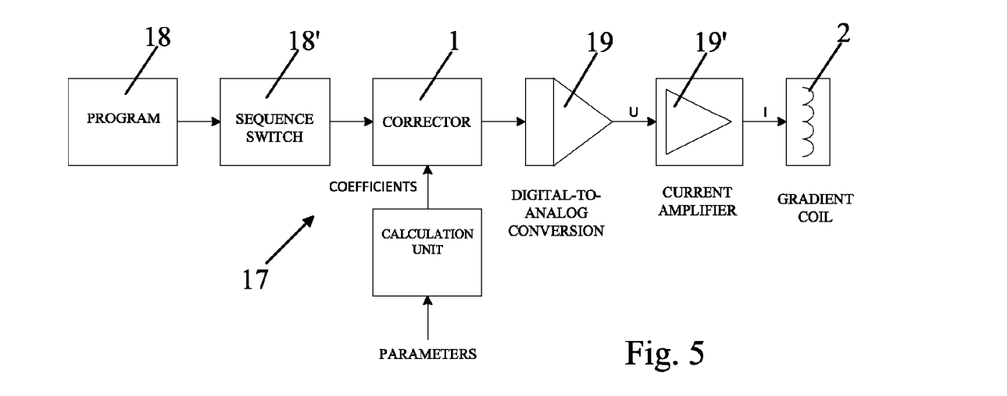
FIG. 5 is a schematic block diagram of a system for the generation of magnetic field gradients integrating a correction device or corrector according to the invention.

The invention also relates to a system 17 of the above-mentioned type, which essentially comprises, as FIG. 5 of the accompanying drawings shows it, means 18, 18' for generation of a digital set-point signal, for example in the form of a train of pulses, means for conversion 19 and amplification 19' of the set-point signal and one or more coil(s) 2 for generation of gradients that are supplied by the amplified signal(s) provided by the associated conversion and amplification means, if necessary respectively corresponding, whereby said system also comprises a device for correction of the set-point signal before its analog conversion and its amplification, and, if necessary, its demultiplication.

This system 17 is characterized in that the correction device is a device 1 as described above.

This system 17 can advantageously consist of a system for the generation of gradients along several axes, whereby a correction device 1 is associated with each axis.

Finally, the invention also relates to a process for real-time correction of variable set-point or control signals of gradient coils of a spectrometry or imagery device by nuclear magnetic resonance based on factors or coefficients for correction or compensation that are provided, whereby this process uses at least one correction device as described above.

This process is characterized in that it essentially consists, at the level of each correction device 1, in converting the successive digital data that together form an original set-point signal for gradient coil(s) into data that are suitable for processing by the unit 5, in processing said converted data into successive operating loops, by means of the arithmetic calculation modules 7, 7' based on micro-instructions that are present in the storage memory 4 and that form a correction algorithm, by taking into account correction coefficients that are present in the working memory(ies) 6, 6' and by storing the intermediate results, as well as the data that result from the corrective processing also in the working memory(ies), and in converting the data that result from the corrective processing into data with a format that is identical to that of the data of the original set-point signal and forming a part of a corrected set-point signal.

Preferably, the processing of data by the unit 5 comprises at least one convolution operation, whereby at least the data of the corrected set-point signal that are calculated during the prior cycle are taken into account. The invention will be described below, by way of example, in a more detailed manner and in connection with the accompanying drawings.

FIG. 6 illustrates the different essential constituent parts of the correction device 1, namely:

The micro-sequencer 3 that is a counter that makes possible the incrementation of the pointer, or ordinal counter, of the micro-code that is executed, The processing unit 5 that consists of basic calculating units or modules 7, 7' as well as multiplexers 10, 14 that make data transfer possible, The memory 6 of correction coefficients determined for the current application, The memory 6' of data that contains the intermediate or final results of calculations made by the processing unit 5, The micro-code memory 4 that contains the microcode that constitutes the micro-program. Each micro-code line, which is a micro-instruction, can optionally control the micro-sequencer 3, the data memory 6' and the coefficient memory 6 (or optionally the single memory divided into zones respectively containing data and coefficients), and the processing unit 5.

The data at the input of the corrector 1 are advantageously coded integers in two's complement, and the output data are also coded integers in two's complement, whereby the data that are effectively processed, in the corrector 1 are in a different format, for example in a floating-comma number, more suitable for the envisioned processing.

All of the components of the correction device 1 operate synchronously using a single clock (signal CLK in FIG. 6). The stream of data at the input and output of device 1 (CORRECTOR_IN and CORRECTOR_OUT) is also synchronized with this clock.

The data registers 8 and 8', as shown in FIG. 6, are refreshed based on a synchronization signal (SYNC) whose period corresponds to an integer that is constant in clock periods CLK. The activation time of the synchronization signal is equal to a clock period. The delay between the data at the input and the corrected data at the output corresponds to the period of the synchronization signal. The start-up of the micro-sequencer 3 is also conditional on this synchronization signal.

The micro-sequencer 3 consists of a counter that is controlled by signals of the device (see FIGS. 6 and 7). The output (OUT) of the micro-sequencer 3 corresponds to the current value of the counter.

The control signals of said micro-sequencer 3 are as follows:

RST: Asynchronous initialization input. This takes priority over the other inputs. When activated, the micro-sequencer 3 is re-initialized, i.e., its output is positioned in the initial state (zero, for example). This input is used during the overall initialization of the corrector, charging, for example.

CLK: Clock input.

IN: (Synchronous) validation input. The output of the counter is incremented, by one step, at each clock period, while this input is validated.

RESTART: (Synchronous) restart input. The micro-sequencer 3 is reinitialized when this input is activated. This input has priority over the input IN. In other words, if the micro-sequencer 3 is deactivated because the input IN is inactive, the activation of RESTART nevertheless reinitializes the micro-sequencer 3.

The output of the micro-sequencer 3 addresses the memory 4 that contains the micro-code. The current value of the counter consequently corresponds to the ordinal counter. The clock input (CLK) of the micro-sequencer 3 is connected to the overall clock of the correction device 1. The validation input (IN) is controlled by the micro-code, via the signal SEQ_IN, while the restart input is connected to the synchronization signal of the device (SYNC in FIG. 6). The ordinal counter can therefore be stopped by the micro-code when the calculations have been performed, and then it is restarted (let us recall that the RESTART input has priority over IN) by the synchronization signal so as to perform the calculations on the following data.

The processing unit 5 was designed so as to use minimal hardware resources while ensuring optimal performances. The performance criteria relate not only to the time of calculation but also to the precision of the latter. The idea of precision of calculations is essential if the corrector 1 is to implement digital filters with infinite pulse response (RII) of an order that is greater than or equal to 2 (the rounding errors can then bring about instability of the filter).

So as to ensure good precision, the processing unit 5 advantageously performs calculations with floating-comma numbers that comply with the standard IEEE 754 (or CEI 60559). Lower precision can suffice depending on the use case; fixed-comma numbers can then be used to save resources. The principle of operation would nevertheless remain identical.

The data at the input and at the output (DATA_IN and DATA_OUT) are coded integers in two's complement. At the input, these data are converted into floating-comma numbers (converter 15="Int2Float" block), and at the output, the data are converted into integers (converter 15'="Float2Int" block).

The data memory 6', which is volatile (of the RAM type), preferably allows three simultaneous accesses to the stored data: two read accesses and one write access, this with three different addresses.

The memory of the coefficients 6, which is also volatile, is characterized by separate read and write ports 11, whereby the write port is connected to a bus coming from a device that is outside of the corrector 10 (see FIG. 5).

The width of a memory line (data or coefficients) corresponds, in practice, to the size of the floating-comma numbers (for example, 64 bits if it is a "double-precision" coding format, according to the standard IEEE 754, or 32 bits in the case of "simple-precision" coding.) The depths of data memory 6' and coefficient memory 6 depend on the type of correction algorithm used.

One of the read ports 11 of the data memory 6' and the read port 11 of the coefficient memory 6 are connected to an operand bus 9 (A-BUS). The source of the operand, located on the A-BUS, is selected via a multiplexer 10. In other words, the operand that is located on A-BUS can be a stored result (source: data memory 6') or a coefficient (source: coefficient memory 6) according to the state of the multiplexer 10.

The second operand bus 9' (B-BUS) is directly connected to the other read port 11 of the data memory 6'.

The operand buses 9 (A-BUS) and 9' (B-BUS) supply arithmetic units or modules 7, 7' for floating-comma numbers: an adder 7 and a multiplier 7'. B-BUS also makes it possible to send the data to the converter 15' [floating-comma number/integer].

A bus 12, referred to as D-BUS, is connected to the write port 13 of the data memory. A multiplexer 14 that makes it possible to select the source of the datum to be stored is placed on this bus. This source can be:

A register that contains the value 0; this makes it possible to initialize a memory line, The result of an integer conversion to a floating-comma number (output of the converter 15). The input datum can thus be stored in the data memory 6', The result of the multiplication of the operands of buses A-BUS and B-BUS (buses 9 and 9'), The result of the addition of the operands of buses A-BUS and B-BUS (buses 9 and 9'), The operand that is located on the bus 9 (A-BUS) makes it possible to move the data into the data memory 6'.

Before being placed in the data memory, the sign of a value can optionally be changed (at the inversion module 13') so as to store its opposite.

It will be noted that the width of all of the buses 9, 9', 12 that are mentioned corresponds to the size of the floating-comma numbers.

Without modifying the principle of operation of device 1, buffer registers can be placed on the access ports of memories 6, 6' so as to increase the frequency of operation of the processing unit 5. This is equivalent to adding pipeline stages. The operation of the units or modules 7 and 7' that perform the arithmetic operations (adder and multiplier) can also rest on transmission lines. The number of necessary stages is dependent upon the frequency of operation and the technology used.

In addition, so as to accelerate the calculations, the processing can be easily vectored. For this purpose, several sub-assemblies [processing units 5/data and coefficient memories 6, 6'] can be placed in parallel while being controlled by the same micro-code.

The cooperative and coordinated operation of the components of the processing unit 5 and data and coefficient memories 6, 6' is conditioned by control signals that correspond to fields that are contained in the micro-instructions.

The control signals are as follows for the example shown in FIG. 8:

D_SEL: Selection of the source of data to be placed on D-BUS (bus 12).

NEG_SEL: Signal for activation of the unit 5, making it possible to reverse the signal of the datum that is present on D-BUS.

D_ADDR: Writing address of the data in the data memory 6'.

D_IN: Validation signal of the write port 13 of the data memory 6'. When this signal is active, the datum that is present on D-BUS (bus 12) is stored in the data memory 6' at the address that is indicated by D_ADDR (bus 9).

A_ADDR: Reading address of the data in the data memory 6' for the first read port 11.

B_ADDR: The same as A_ADDR, for the second read port 11 of the data memory 6'.

COEFF_ADDR: Reading address of the data in the coefficient memory 6.

A_SEL: Selection of the source of data to be placed on A-BUS (bus 9).

OUT_IN: Validation signal of the register that contains the result of the conversion unit 8' [floating-comma numbers to integers]. This datum corresponds to the final result that is calculated by the processing unit 5.

The micro-code memory 4 (storage memory of the micro-instructions) is not volatile and has a single access door. Each line of this memory 4 contains a micro-instruction. Its address bus is connected to the ordinal counter, which corresponds to the output of the micro-sequencer 4, while its data bus conveys the micro-instructions. The size of the memory 4 depends on the type of correction algorithm implemented: the number of lines is based on the quantity of micro-instructions to be executed, and the size of a line is related to the quantity of locations of data and coefficient memories to be addressed.

This micro-code memory can be volatile if it proves necessary to improve the flexibility of the correction device 1 by changing the type of algorithm. This has no influence on the principle of operation of said corrector 1.

In the example shown in FIG. 9, each micro-instruction is coded in the form of fixed fields, each field containing a control signal. The control signals are those enumerated in the preceding section to which is added the validation signal of the micro-sequencer 4 (SEQ_IN). The signals A_SEL, A_ADDR, and COEFF_ADDR are combined in a single field. The size of this field corresponds to the size of the largest address bus between A_ADDR and COEFF_ADDR, plus one bit for A_SEL. Actually, through the operand bus, A-BUS (bus 9) passes only one datum at a time, which comes either from the data memory 6' or the coefficient memory 6.

Below, a nonlimiting example of implementation of a function by the correction device or corrector 1 will be described in more detail.

The example that is described below exhibits the use of the corrector 1 in a system 17 for the generation of gradients equipped with a single axis, and therefore a single gradient coil 2 and a single current amplifier 19' (as shown in FIG. 5).

More specifically, the corrector 1 implements three filtering cells 16 in parallel in the example that is described (see FIG. 10).

Each cell 16 corresponds to a high-pass digital filter of the first order. This configuration makes it possible to act on six parameters (the gain and the time constant of each cell 16) of the corrector 1 so as to obtain the best gradient field possible.

The transfer function of a filtering cell 16 can be determined as follows:

1) Transfer function in the Laplace plane of a high-pass filter of the first order:

$$H(s) = k \frac{\tau s}{\tau s + 1}$$

With:

k the gain $\tau$ the time constant

2) Transfer function in the z plane, bilinear transformation:

$$s = 2f \frac{1 - z^{-1}}{1 + z^{-1}}$$

With:

f the sampling frequency, which within the framework of the corrector 1 corresponds to the frequency of the synchronization signal SYNC (see FIG. 6).

3) Transfer function in the z plane:

$$H(z^{-1}) = A \frac{1-z^{-1}}{1+Bz^{-1}} \quad (1)$$

With:

$$A = k \frac{2f\tau}{1+2f\tau} \quad (2)$$

$$B = k \frac{1-2f\tau}{1+2f\tau} \quad (3)$$

4) Transposition of the equation (1) into the temporal domain:

$$y(n)=A(x(n)-x(n-1))-By(n-1) \quad (4)$$

5) Transfer function in the temporal domain of the corrector 1 that is shown in FIG. 10 is:

$$y(n)=x(n)+y_1(n)+y_2(n)+y_3(n) \quad (5)$$

By using the equation (4) with (5), we obtain:

$$y(n)=x(n)+A_1(x(n)-x(n-1))-B_1y_1(n-1)+A_2(x(n)-x(n-1))-B_2y_2(n-1)+A_3(x(n)-x(n-1))-B_3y_3(n-1)$$

Each pair of coefficients ($A_m$; $B_m$) is calculated using the equations (2) and (3) by taking into consideration the gain $\kappa_m$ and the time constant $\tau_m$ of each cell 16 that, in the example described, are the input parameters of the system 17.

The terms $A_1$, $A_2$, $A_3$, $B_1$, $B_2$, $B_3$ can be identified with coefficients of the corrector 1. The calculation of these terms based on gains and constants does not exhibit the real-time aspect. This calculation can consequently be performed by an external device that is not part of the corrector 1 (calculation unit in FIG. 5) and does not require an additional description, taking account of the knowledge of one skilled in the art.

In the case where the input parameters of the system are the gains and time constants of three cells 16 in the analog field, the external device—during the calculation of coefficients—should compensate for the deformation of frequency provided by the bilinear transformation.

Within the framework of the practical example that is described, it is then necessary to carry out the implementation of the correction algorithm.

Figure 11:
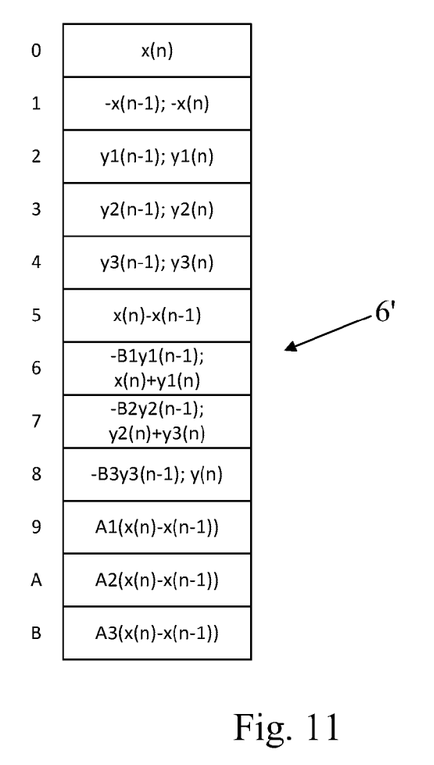
FIGS. 11 and 12 are schematic representations that illustrate the contents of memories or memory zones that respectively store data (FIG. 11) and the correction coefficients (FIG. 12) and are combined with the processing unit as shown in FIG. 6.
Figure 12:
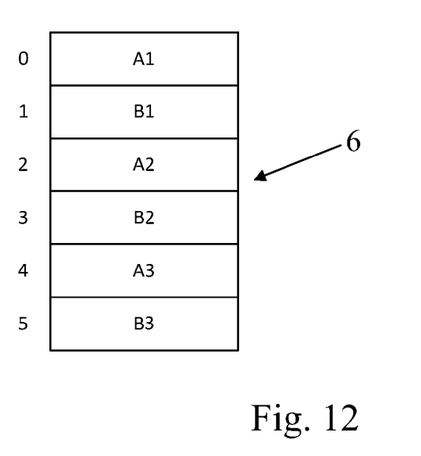

To implement this algorithm, it is necessary to consider that the components of the corrector 1 have the following characteristics:

Initial value of the ordinal counter: 0
Calculations on the extended-precision floating-comma numbers according to the standard IEEE 754 (64 bits including 1 sign bit, 11 exponent bits, and 52 mantissa bits).
No vectored processing: the corrector 1 consists of a single subassembly [processing unit 5/data and coefficient memories 6, 6'].
Number of pipeline stages constituting the calculation units per floating-comma numbers:
Multiplier: Five stages of communication channels (pipeline)
Adder: Seven stages of communication channels (pipeline)
Access ports for reading memories 4, 6, 6' equipped with buffer registers: latency of one clock period during an access.
Format converters of numbers 15, 15' and sign inversion unit 13' without a pipeline stage (communication channels).
Selection codes of the multiplexer 14 supplying D-BUS (bus 12):
000: Register containing 0
001: Output of the integer converter 15 to floating-comma numbers
010: Result at the output of the multiplier 7'
011: Result at the output of the adder 7
100: Datum present on A-BUS (bus 9)
Selection codes of the multiplexer 10 supplying A-BUS (bus 9):
0: First read port 11 of the data memory 6'
1: Read port 11 of the coefficient memory 6
Structure of micro-instructions: A micro-instruction is coded on 20 bits; the fields are as follows:
SEQ_IN: 1 bit
OUT_IN: 1 bit
NEG_IN: 1 bit
D_IN: 1 bit
D_ADDR: 4 bits
A_SEL: 1 bit
A_ADDR/COEFF_ADDR: 4 bits
B_ADDR: 4 bits
D_SEL: 3 bits
Size of the micro-code memory 4: 61×20 bits
Size of the data memory 6: 12×64 bits
Size of the coefficient memory 6: 6×64 bits
FIGS. 11 and 12 show the contents of the data memory 6' and the coefficient memory 6. The notation of the addresses is hexadecimal. So as to reduce the quantity of data memory that is necessary, the same line can contain different data based on the evolution of the execution of the algorithm: the address 8, for example, first contains the result of the multiplication of $R_s$ by $y_s(n-1)$, and then the final result $y(n)$.

The following table comprises the successive operations that correspond to the algorithm of the example that is described (each line of the table corresponds to a micro-construction and therefore to a line of the micro-code memory).

| Line | Description of the Operation |
| --- | --- |
| 0 | Storage of x(n); reading of B1 and y1(n − 1) |
| 1 | Reading of B2 and y2(n − 1) |
| 2 | Reading of x(n) and −x(n − 1) |
| 3 | Operation step |
| 4 | Replacement of −x(n − 1) by x(n); reading of B3 and y3(n − 1) |
| 5 | Operation step |
| 6 | Operation step |
| 7 | Storage of −B1y1(n − 1) |
| 8 | Storage of −B2y2(n − 1) |
| 9 | Operation step |
| 10 | Storage of x(n) − x(n − 1) |
| 11 | Storage of −B3y3(n − 1) |
| 12 | Reading of A1 and x(n) − x(n − 1) |
| 13 | Reading of A2 and x(n) − x(n − 1) |
| 14 | Reading of A3 and x(n) − x(n − 1) |
| 15 | Operation step |
| 16 | Operation step |
| 17 | Operation step |
| 18 | Operation step |
| 19 | Storage of A1(x(n) − x(n − 1)) |
| 20 | Storage of A2(x(n) − x(n − 1)) |
| 21 | Storage of A3(x(n) − x(n − 1)) |
| 22 | Reading of A1(x(n) − x(n − 1)) and −B1y1(n − 1) |
| 23 | Reading of A2(x(n) − x(n − 1)) and −B2y2(n − 1) |
| 24 | Reading of A3(x(n) − x(n − 1)) and −B3y3(n − 1) |

-continued

| Line | Description of the Operation |
|---|---|
| 25 | Operation step |
| 26 | Operation step |
| 27 | Operation step |
| 28 | Operation step |
| 29 | Operation step |
| 30 | Operation step |
| 31 | Storage of y1(n) |
| 32 | Storage of y2(n) |
| 33 | Storage of y3(n); reading of x(n) and y1(n) |
| 34 | Operation step |
| 35 | Reading of y2(n) and y3(n) |
| 36 | Operation step |
| 37 | Operation step |
| 38 | Operation step |
| 39 | Operation step |
| 40 | Operation step |
| 41 | Operation step |
| 42 | Storage of x(n) + y1(n) |
| 43 | Operation step |
| 44 | Storage of y2(n) + y3(n) |
| 45 | Operation step |
| 46 | Reading of x(n) + y1(n) and y2(n) + y3(n) |
| 47 | Operation step |
| 48 | Operation step |
| 49 | Operation step |
| 50 | Operation step |
| 51 | Operation step |
| 52 | Operation step |
| 53 | Operation step |
| 54 | Operation step |
| 55 | Storage of y(n) |
| 56 | Operation step |
| 57 | Reading of y(n) |
| 58 | Operation step |
| 59 | Activation of the output register |
| 60 | Standby |

As a variant of practical implementation of the correction device according to the invention (relative to the high-pass digital filter of the first order described in detail above), it is also possible to implement a recursive filter of the second order with infinite pulse response whose transfer function in the z plane is established as follows:

$$H(z^{-1}) = \frac{b_0 + b_1 z^{-1} + b_2 z^{-2}}{1 + a_1 z^{-1} + a_2 z^{-2}}$$

which, in the temporal domain, leads to the following function:

$$y(n) = b_0 x(n) + b_1 x(n-1) + b_2 x(n-2) - a_1 y(n-1) - a_2 y(n-2)$$

In the same manner as for the filter of the first order, the coefficients a and b are stored in the memory 6 of the coefficients, whereby the samples x (input of the filter) and y (output of the filter) are stored in the data memory 6'.

Of course, the invention is not limited to the embodiment that is described and shown in the accompanying drawings. Modifications are possible, in particular from the standpoint of the composition of the various elements or by substitution of equivalent techniques, without thereby exceeding the field of protection of the invention.

The invention claimed is:

1. A device (1) that is compatible with nuclear magnetic resonance (NMR) and configured for real-time correction of variable set-point signals of gradient coils of a spectrometry, or imagery device, by nuclear magnetic resonance, based on factors, or coefficients of correction, or coeffecients of compensation that are provided, comprising:

an input of the device that receives original digital set-point signals;
an output of the device connected to a gradient coil of one of
i) a nuclear magnetic resonance spectrometry device, and
ii) a nuclear magnetic resonance imagery device,
wherein the output of the device delivers, to the gradient coils, set-point signals that have been modified as part of a correction cycle, in order to compensate for the effects, limitations, disruptions, interference, and negative effects subsequently encountered during processing, transmission, transformation, and/or application of said set-point signals; and
at least one circuit (1') connected between said input of the device and said output of the device, with said at least one circuit being a micro-programmed structure composed of plural subassemblies (3, 4, 5, 6, 6', 7, 7'), that are operationally different from one another and work with digital components;
these plural sub-assemblies comprising:
a micro-sequencer (3) forming a counter,
a memory (4) configured for storing micro-instructions,
a processing unit (5) combined with at least one working memory (6, 6')
and
two Integrating arithmetic calculation modules (7, 7');
wherein said processing unit (5) modifies data of the received original digital set-point signals in a correction cycle by taking into account the factors, or coefficients of correction, or coefficients of compensation that are provided, in accordance with the micro-instructions that are addressed by the micro-sequencer (3) in the storage memory (4), and that form an arithmetic correction algorithm that controls the operation of the operationally different plural subassemblies (3, 4, 5, 6, 6', 7, 7'), that constitute the at least one circuit (1'), and are programmed based on the correction to be implemented,
wherein the at least one working memory (6, 6') stores:
i) correction coefficients that are used by the arithmetic correction algorithm; and
ii) an output datum/output data of at least one corrected set-point signal, and
wherein the two integrating arithmetic calculation modules (7, 7') provide the correction of the original digital set-point signals in real-time based on a convolution operation using the correction coefficients and the stored output datum/output data of the working memory from at least one prior correction cycle of the digital set-point signals.

2. A device according to claim 1, wherein the sequencing of the data at an input register (8) and an output register (8') of said device (1), as well as the resetting to zero of the microsequencer (3) are controlled by a synchronization signal (SYNC) whose period Is a multiple of the clock signal (CLK) that concatenate the operation of the different constituent plural sub-assemblies (3, 4, 5, 6, 6', 7, 7'), and wherein the two arithmetic calculation modules (7, 7') consist of pipelines.

3. A device according to claim 1, wherein the working memory(ies) (6, 6') comprise(s):
at least a first memory zone (6) that is designed in order to store the correction coefficients that are used by the arithmetic correction algorithm; and
at least a second memory zone (6') that is designed in order to store the input data requiring correction, with intermediate result(s) of the arithmetic operations implemented by the two arithmetic calculation modules (7, 7'), and with the final result corresponding to corrected output data.

4. A device according to claim 3,
wherein said at least one second memory zone (6'), is also capable of storing and that intended to store the output datum/data of the at least one corrected digital set-point signal that is produced during at least one prior correction cycle, which includes the corrected set-point signal of the preceding cycle, and
wherein the current corrected set-point signal result from a convolution operation that is implemented by means of the two integrating arithmetic calculation modules (7,7').

5. A device according to claim 2,
wherein the processing unit (5) also comprises,
on the one hand:
  buses (9, 9') are configured for a transmission of operands, where the buses (9, 9') are optionally combined with at least one multiplexer (10);
  the multiplexer (10) supplying the two integrating arithmetic calculation modules (7,7'), based on elementary control signals of the micro-instructions being executed, with data and coefficients being extracted from the working memory(ies) (6, 6'), by means of reports (11); and
on the other hand;
  at least one data supply bus (12) connecting to sign maintaining write port (13) of the second memory or memory zone (6'); and
  the at least one data supply bus (12) optionally connecting a a sign inverting module (13');
  the data supply bus (12) being combined upstream with a multiplexer (14) that is, connected to the output of the two integrating arithmetic calculation modules (7,7');
  the data supply bus 12 also being connected to the input register (8) of the datum to be corrected, and
  when necessary, data supply bus 12 also connects to at least one of the buses (9,9') providing the transmission of operands;
  data supply bus 12 is also optionally connected to a zeroing register, with the state of said multiplexer (14) also being determined by the elementary control signals of the micro-instructions being executed.

6. A device according to claim 1,
wherein the device also comprises two mutually inverse conversion modules (15,15'), at the input of the device and at the output of the device, whereby input data, and output data are, coded as integers.

7. A device according to claim 6,
wherein the two mutually inverse conversion modules (15, 15') respectively consist of a module which converts integers into double-precision floating-point 64-bit numbers.

8. A device according to claim 1,
wherein the device is a vectorial structure and comprises several circuits (1') that are arranged in parallel, each circuit integrating a separate sub-assembly selected from the group of: micro-sequencer (3), storage, memory (4), processing unit (5), and working memory (ies) (6,6').

9. A device according to claim 1,
wherein the device also contains three filtering cells (16) that are arranged in parallel, to one another with each filtering cell preferably corresponding to a high-pass digital filter of the first order, and the device is programmed in order to implement filtering in each of the three filtering cells (16), T.

10. A device according to claim 1, wherein said gradient coil is a gradient coil amplifier.

11. A device according to claim 1, wherein an output of the datum/data of the at least one corrected set-point signal stored in the at least one working memory (6,6') was produced during at least one prior correction cycle of the device.

12. A device according to claim 6, wherein the two mutually inverse conversion modules (15,15') respectively consist of:
  i) a module that converts integers into 64-bit double-precision floating-point numbers, and
  ii) an inverse number format converting module.

13. A device according to claim 6, wherein the two mutually inverse conversion modules (15,15') respectively consist of:
  i) a module that converts integers into 64-bit double-precision floating-point numbers, according to the standard IEEE 754, and
  ii) an inverse number format converting module.

14. A device according to claim 6, wherein the two mutually inverse conversion modules (15,15') respectively consist of:
  i) a module that converts integers into double-precision floating-point numbers, and
  ii) an inverse number format converting module.

* * * * *